(12) United States Patent
Hsieh et al.

(10) Patent No.: US 10,600,833 B2
(45) Date of Patent: Mar. 24, 2020

(54) IMAGE SENSOR

(71) Applicant: HIMAX TECHNOLOGIES LIMITED, Tainan (TW)

(72) Inventors: Yu-Jui Hsieh, Tainan (TW); Po-Nan Chen, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 15/446,010

(22) Filed: Mar. 1, 2017

(65) Prior Publication Data

US 2018/0254295 A1 Sep. 6, 2018

(51) Int. Cl.
*H01L 27/146* (2006.01)

(52) U.S. Cl.
CPC .. *H01L 27/14621* (2013.01); *H01L 27/14618* (2013.01); *H01L 27/14627* (2013.01); *H01L 27/14645* (2013.01); *H01L 27/14649* (2013.01); *H01L 27/14685* (2013.01)

(58) Field of Classification Search
CPC ................................................ H01L 27/14621
See application file for complete search history.

(56) References Cited

U.S. PATENT DOCUMENTS

| | | | |
|---|---|---|---|
| 2001/0042876 A1* | 11/2001 | Wester | H01L 27/14621 257/292 |
| 2006/0044449 A1* | 3/2006 | Sakoh | H01L 27/14621 348/336 |
| 2007/0102621 A1* | 5/2007 | Kim | H01L 27/14627 250/208.1 |
| 2007/0153160 A1* | 7/2007 | Lee | G02F 1/133512 349/95 |
| 2007/0201738 A1 | 8/2007 | Toda et al. | |
| 2008/0023858 A1 | 1/2008 | Kobayashi et al. | |
| 2009/0040345 A1* | 2/2009 | Fukuyoshi | G02B 5/201 348/273 |
| 2009/0147101 A1* | 6/2009 | Tatani | H01L 27/14621 348/224.1 |
| 2011/0013055 A1* | 1/2011 | Sul | H01L 27/14621 348/273 |
| 2011/0235017 A1* | 9/2011 | Iwasaki | H04N 5/2354 356/4.01 |
| 2012/0056073 A1* | 3/2012 | Ahn | H01L 27/14609 250/208.1 |
| 2012/0086093 A1* | 4/2012 | Otsuka | H01L 27/14621 257/432 |
| 2015/0311239 A1 | 10/2015 | Won et al. | |
| 2016/0033688 A1* | 2/2016 | Wu | G02B 3/0068 359/622 |

(Continued)

*Primary Examiner* — Wael M Fahmy
*Assistant Examiner* — Sarah K Salerno
(74) *Attorney, Agent, or Firm* — CKC & Partners Co., LLC

(57) ABSTRACT

An image sensor is provided. The image sensor includes a visible light receiving portion and an infrared receiving portion. The visible light receiving portion is configured to receive a visible light. The infrared receiving portion is configured to receive infrared. The visible light receiving portion includes a color filter ball layer configured to collect the visible light. In some embodiments of the present invention, the infrared receiving portion includes an infrared pass filter ball layer configured to collect the infrared. In some other embodiments of the present invention, the infrared receiving portion includes a white filter ball layer configured to collect the infrared.

18 Claims, 5 Drawing Sheets

(56) References Cited

U.S. PATENT DOCUMENTS

2016/0099280 A1* 4/2016 Huang .............. H01L 27/14621
  250/208.1
2017/0034456 A1* 2/2017 Kyung .................. H04N 5/332

* cited by examiner

IMAGE SENSOR

BACKGROUND

Field of Invention

The present invention relates to an image sensor. More particularly, the present invention relates to an image sensor having infrared sensing function.

Description of Related Art

With the development of the access control systems and security systems, the biometric technologies using human characteristics to confirm personal identity becomes prevalent. Iris recognition technology is a popular one of the biometric technologies since the iris recognition technology has high reliability. When the iris recognition technology is applied in an electronic device, such as a smart phone, an image sensor capable of receiving visible light and infrared separately is required to implement iris recognition function. A conventional image sensor has two different portions for receiving visible light and infrared separately.

SUMMARY

The present invention provides an image sensor. The image sensor includes a visible light receiving portion and an infrared receiving portion. The visible light receiving portion is configured to receive a visible light. The infrared receiving portion is configured to receive infrared. The visible light receiving portion includes a color filter ball layer configured to collect the visible light. In some embodiments of the present invention, the infrared receiving portion includes an infrared pass filter ball layer configured to collect the infrared. In some other embodiments of the present invention, the infrared receiving portion includes a white filter ball layer configured to collect the infrared.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

Figure 1:
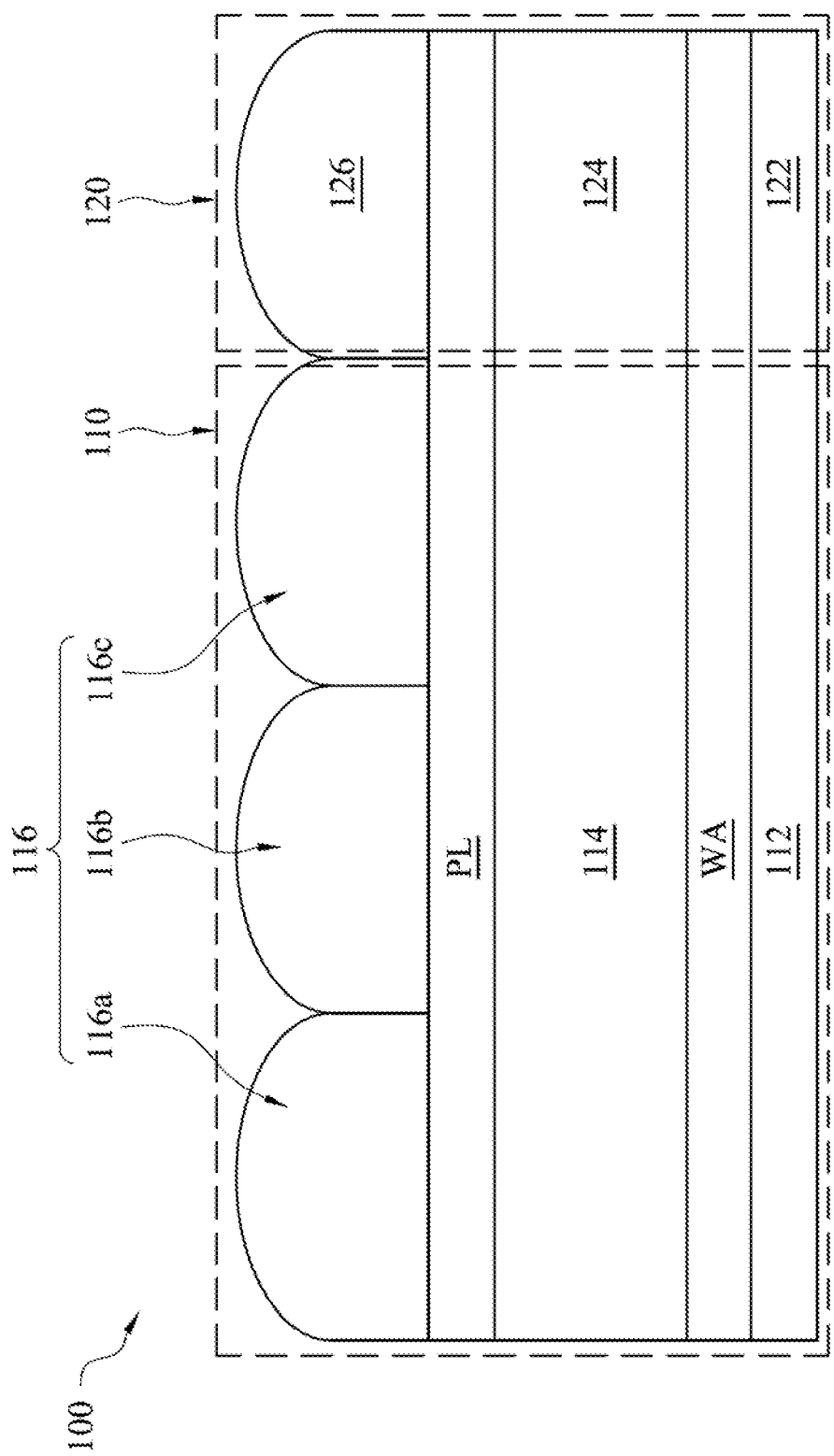
FIG. 1 is a cross-sectional view of an image sensor according to a first embodiment of the present invention.

FIG. 1 is a cross-sectional view of an image sensor 100 according to a first embodiment of the present invention. As shown in FIG. 1, the image sensor 100 includes a visible light receiving portion 110 and an infrared receiving portion 120. The visible light receiving portion 110 is configured to receive a visible light, and the infrared receiving portion 120 is configured to receive infrared.

As shown in FIG. 1, the visible light receiving portion 110 includes a visible light sensing layer 112, an infrared cutoff filter 114 and a color filter ball layer 116. The color filter ball layer 116 is disposed on the infrared cutoff filter 114 and the infrared cutoff filter 114 is disposed on the visible light sensing layer 112 to provide color light to the visible light sensing layer 112, and the visible light sensing layer 112 is configured to receive the visible light to generate main image signals accordingly. In this embodiment, the visible light sensing layer 112 includes at least one photodiode for sensing the color light, and the photodiode may be a complementary metal oxide semiconductor (CMOS) diode. However, embodiments of the present invention are not limited thereto.

The infrared cutoff filter 114 is configured to cutoff the infrared. In other words, the infrared cutoff filter 114 can block the transmission of the infrared, while passing the light. In this embodiment, the infrared cutoff filter 114 blocks lights having a wavelength greater than 850 nm, but embodiments of the present invention are not limited thereto.

The color filter ball layer 116 is configured to collect the visible light and to provide the color light. In this embodiment, the color filter ball layer 116 includes a red color filter unit 116a, a blue color filter unit 116b and a green color filter unit 116c, but embodiments of the present invention are not limited thereto.

As shown in FIG. 1, the infrared receiving portion 120 includes an infrared sensing layer 122, a white filter 124 and an infrared pass filter ball layer 126. The infrared pass filter ball layer 126 is disposed on the white filter 124 and the white filter 124 is disposed on the infrared sensing layer 122 to provide the infrared to the infrared sensing layer 122, and the infrared sensing layer 122 is configured to receive the infrared to generate auxiliary image signals accordingly. In this embodiment, the infrared sensing layer 122 includes at least one photodiode for sensing the infrared, and the photodiode may be a CMOS diode. However, embodiments of the present invention are not limited thereto.

The infrared pass filter ball layer 126 is configured to collect the infrared and to cutoff the visible light. In other words, the infrared pass filter ball layer 126 can block the transmission of the visible light, while passing the light. In this embodiment, the infrared pass filter ball layer 126 blocks lights having a wavelength smaller than 850 nm, but embodiments of the present invention are not limited thereto.

The white filter 124 is configured to allow the passage of the infrared. In this embodment, the white filter 124 is a white photoresist, but embodiments of the present invention are not limited thereto.

Specifically, when the image sensor 100 is used to sense an object (for example iris), the object is focused though the color filter ball layer 116 and the infrared pass filter ball layer 126. Further, focus of the image sensor 100 can be adjusted by varying a thickness of the color filter ball layer 116 and a thickness of the infrared pass filter ball layer 126. It is noted that the thickness of the color filter ball layer 116 is substantially equal to that of the infrared pass filter ball layer 126 in this embodiment, but embodiments of the present invention are not limited thereto.

As shown in FIG. 1, the visible light receiving portion 110 and the infrared receiving portion 120 further include a wafer WA and a planarization layer PL. The wafer WA is formed on the visible light sensing layer 112 and the infrared sensing layer 122 to provide a substrate on which the infrared cutoff filter 114 and the white filter 124 are formed. In this embodiment, the wafer WA is a glass wafer, but embodiments of the present invention are not limited thereto. It is noted that a thickness of the infrared cutoff filter 114 is substantially equal to that of the white filter 124 in this embodiment, but embodiments of the present invention are not limited thereto.

The planarization layer PL is formed on the infrared cutoff filter 114 and the white filter 124 to provide a flat surface on which the color filter ball layer 116 and the infrared pass filter ball layer 126 are disposed. The planarization layer PL also provides a good interface to help the color filter ball layer 116 and the infrared pass filter ball layer 126 to be attached on the planarization layer PL.

The light path of the infrared received by the infrared sensing layer 122 extends from the infrared pass filter ball layer 126 through the planarization layer PL and the white filter 124. In comparison with the conventional image sensor, the infrared received by the image sensor 100 has a smaller loss of intensity since a decrease of the light path of the infrared. Therefore, the infrared received by the image sensor 100 has a better intensity to meet a user's demand.

Figure 2:
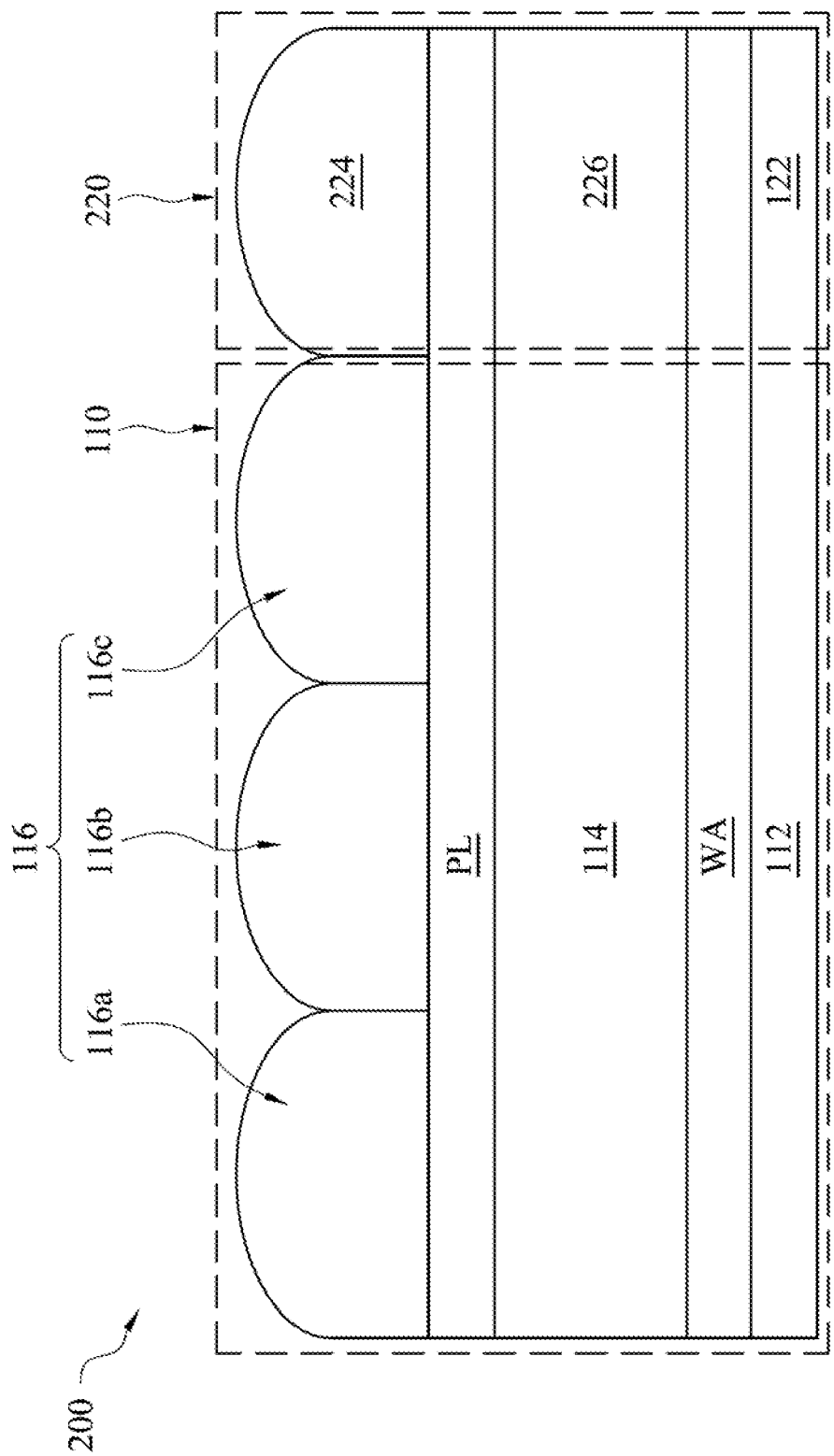
FIG. 2 is a cross-sectional view of an image sensor according to a second embodiment of the present invention.

FIG. 2 is a cross-sectional view of an image sensor 200 according to a second embodiment of the present invention. As shown in FIG. 2, the image sensor 200 includes the visible light receiving portion 110 and an infrared receiving portion 220, in which the infrared receiving portion 220 includes an infrared pass filter 226 and a white filter ball layer 224. The structure of the image sensor 200 is similar to the structure of the image sensor 100 except that the white filter 124 and the infrared pass filter ball layer 126 are replaced with the infrared pass filter 226 and the white filter ball layer 224 respectively.

The infrared pass filter 226 is configured to cutoff the visible light. In other words, the infrared pass filter 226 can block the transmission of the visible light, while passing the light. In this embodiment, the infrared pass filter 226 blocks lights having a wavelength smaller than 850 nm, but embodiments of the present invention are not limited thereto.

The white filter ball layer 224 is configured to collect the light and to allow the passage of the light. In this embodiment, the white filter ball layer 224 is a white photoresist, but embodiments of the present invention are not limited thereto.

Specifically, when the image sensor 200 is used to sense an object (for example iris), the object is focused though the color filter ball layer 116 and the white filter ball layer 224. Further, focus of the image sensor 200 can be adjusted by varying a thickness of the color filter ball layer 116 and a thickness of the white filter ball layer 224. It is noted that the thickness of the color filter ball layer 116 is substantially equal to that of the white filter ball layer 224 in this embodiment, but embodiments of the present invention are not limited thereto.

The light path of the infrared received by the infrared photodiode 122 extends from the white filter ball layer 224 through the planarization layer PL and the infrared pass filter 226. Similar to the image sensor 100, the infrared received by the image sensor 200 has a better intensity to meet a user's demand.

Figure 3:
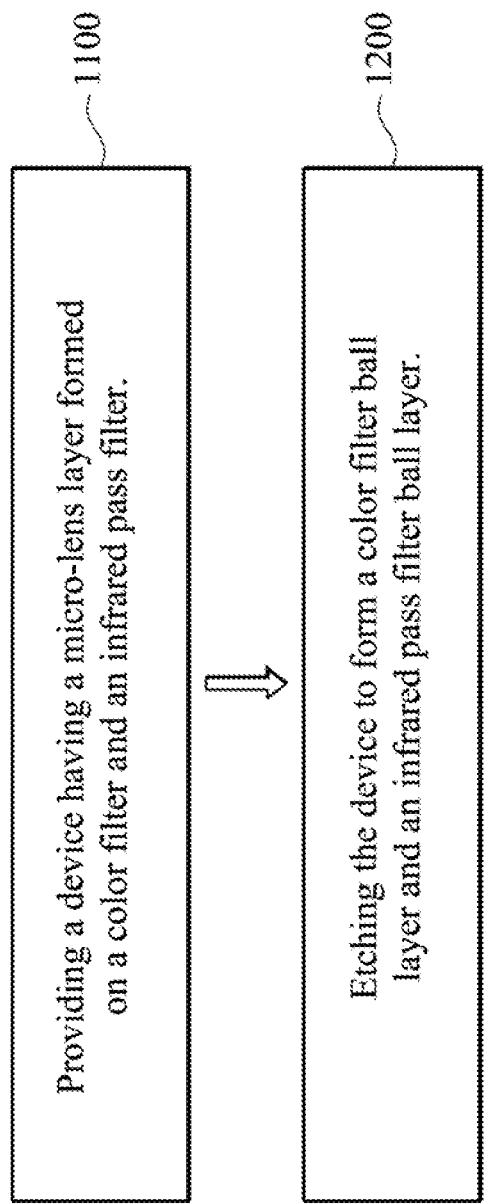
FIG. 3 is a flow chart showing a method for forming the image sensor according to the first embodiment of the present invention.
Figure 4A:
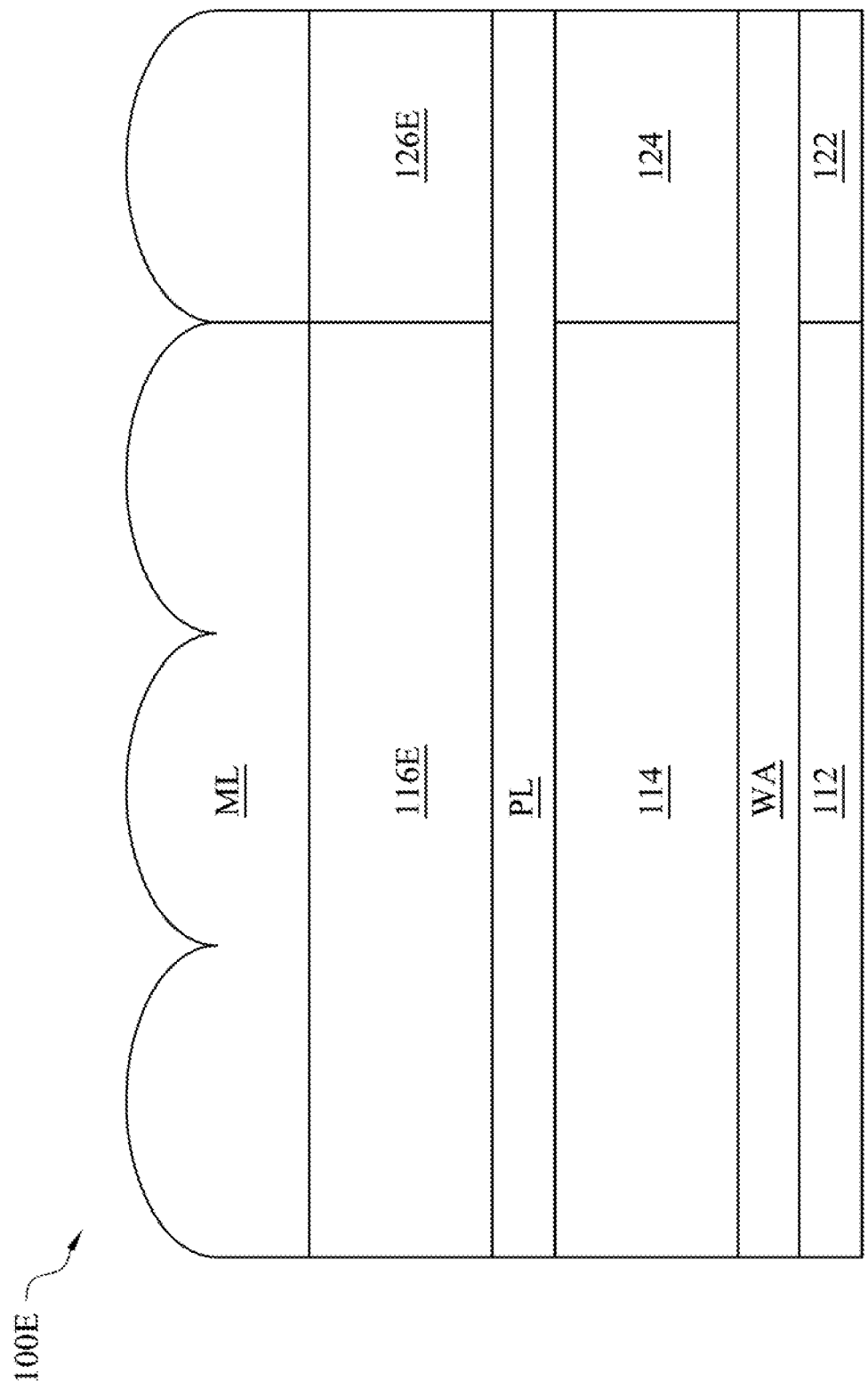
FIGS. 4a-4b are cross-sectional views of the image sensor corresponding to the steps of the method for forming the image sensor in accordance with the first embodiment of the present invention.
Figure 4B:
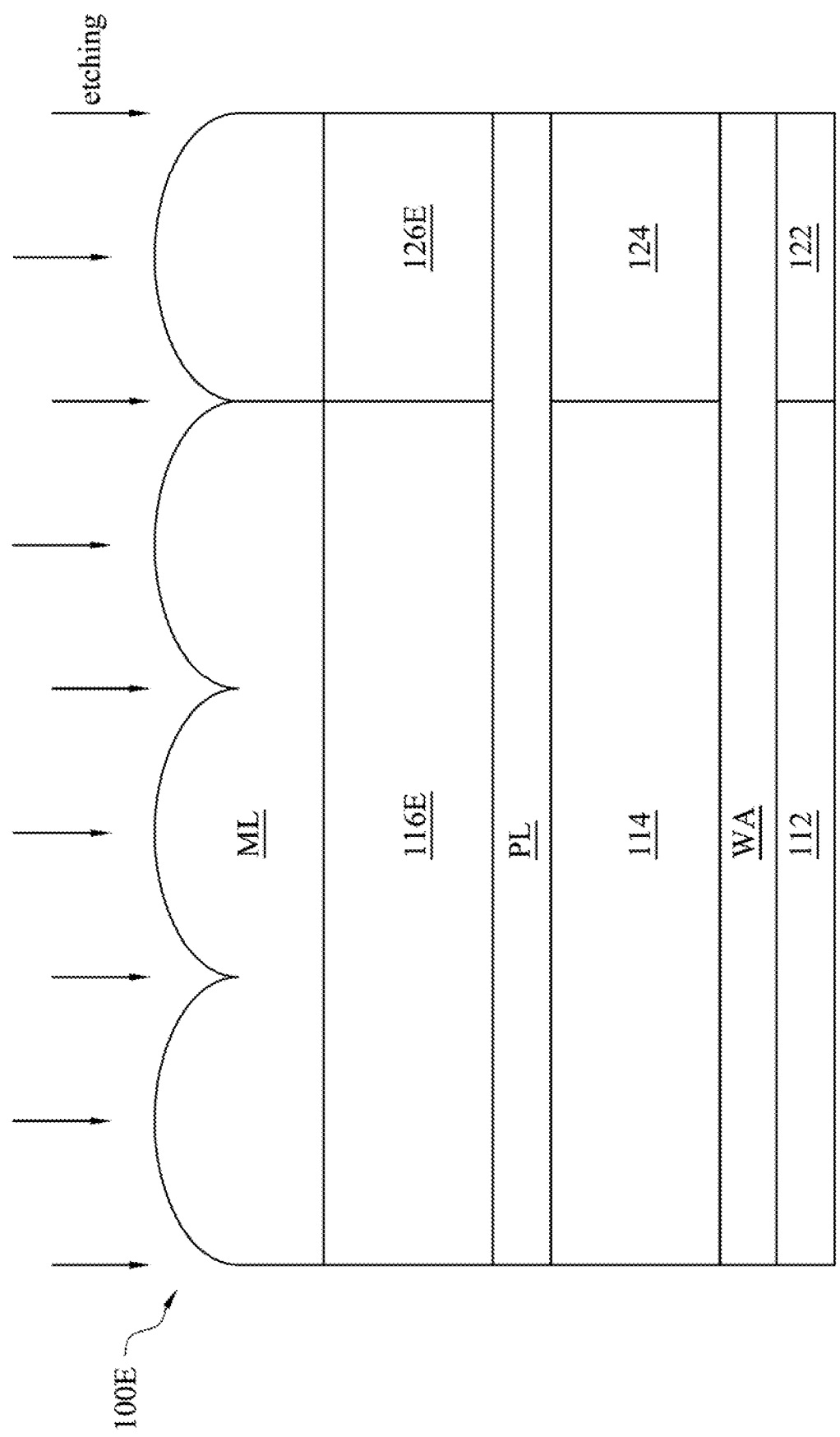

Referring to FIG. 3 and FIGS. 4a-4b, FIG. 3 is a flow chart showing a method 1000 for forming the image sensor 100 according to the first embodiment of the present invention, and FIGS. 4a-4b are cross-sectional views of the image sensor 100 respectively corresponding to the steps 1100-1200 of the method 1000 for forming the image sensor 100 in accordance with the first embodiment of the present invention. The method 1000 starts from step 1100. In step 1100, a device 100E is provided as shown in FIG. 4a. The device 100E includes the visible light sensing layer 112, the infrared sensing layer 122, the wafer WA, the infrared cutoff filter 114, the white filter 124, the planarization layer PL, a color filter 116E, an infrared pass filter 126E, and a micro-lens layer ML, in which the micro-lens layer ML is formed on the color filter 116E and the infrared pass filter 126E to be used as a mask for the color filter 116E and the infrared pass filter 126E. It is noted that the material of the micro-lens layer ML may be epoxy, optical cement, polymethylmethacrylates (PMMAs), polyurethanes (PUs), polydimethylsiloxane (PDMS), or other thermal curing or photo-curing transparent materials, but the present invention is not limited thereto.

As shown in FIG. 4b, in step 1200 of the method 1000, the device 100E is etched by an etching process. Specifically, the micro-lens layer ML is etched to enable the remained color filter 116E and the remained infrared pass filter 126E have the top surfaces substantially the same as that of the micro-lens layer ML respectively, thereby forming the color filter ball layer 116 and the infrared pass filter ball layer 126 as shown in FIG. 1. Thus, the image sensor 100 is formed.

It is noted that a method for forming the image sensor 200 is similar to the method for forming the image sensor 100. Thus, the description of steps of the method for forming the image sensor 200 is not described again herein, From the above description, the structure of the image sensor of the present invention may effectively improve the intensity of the infrared received by the image sensor to meet a user's demand, thereby reducing the difficulty of follow-up analysis of the optical signal (for example image signal) on other instruments.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. An image sensor, comprising:
a visible light receiving portion configured to receive a visible light, wherein the visible light receiving portion comprises;
a color filter ball layer configured to focus the visible light and to provide color light;
a visible light photodiode; and
an infrared cutoff filter disposed on the visible light photodiode;
wherein the color filter ball layer is disposed on the infrared cutoff filter, and the visible light is received by the visible light photodiode after passing through the color filter ball layer and the infrared cutoff filter, wherein an upper surface of the color filter ball layer is convex and is a curved surface, wherein a bottom surface of the color filter ball layer is a flat surface, wherein the color filter ball layer further comprises straight sidewalls;

an infrared receiving portion configured to receive infrared, wherein the infrared receiving portion comprises;
an infrared pass filter ball layer configured to focus the infrared and to cutoff the visible light;
an infrared photodiode; and
a white filter disposed in the infrared photodiode;
wherein the infrared pass filter ball layer is disposed on the white filter, and the infrared is received by the infrared photodiode after passing through the infrared pass filter ball layer and the white filter,
wherein an upper surface of the infrared pass filter ball layer is convex and is a curved surface, wherein a bottom surface of the infrared pass filter ball layer is a flat surface, wherein the infrared pass filter ball layer further comprises straight sidewalls;
wherein the visible light photodiode, the infrared cutoff filter, and the color filter ball layer are stacked in this order in a vertical direction,
wherein the infrared photodiode, the white filter, and the infrared pass filter ball layer are stacked in this order in the vertical direction;
wherein the infrared cutoff filter is adjacent to the white filter in a horizontal direction which is perpendicular to the vertical direction; and
wherein a thickness of the infrared cutoff filter in the vertical direction is substantially equal to a thickness of the white filter in the vertical direction; and
a planarization layer configured to provide a flat surface to allow the color filter ball layer and the infrared pass filter ball layer to be directly attached on the flat surface of the planarization layer.

2. The image sensor of claim 1, further comprising a wafer located on the visible light photodiode and the infrared photodiode, wherein a first portion of the wafer is located in the visible light receiving portion and a second portion of the wafer is located in the infrared receiving portion.

3. The image sensor of claim 2, wherein the first portion of the wafer is located between the infrared cutoff filter and the visible light photodiode, and the second portion of the wafer is located between the white filter and the infrared photodiode.

4. The image sensor of claim 1, wherein the color filter ball layer comprises a red color filter unit, a green color filter unit, and a blue color filter unit.

5. The image sensor of claim 1, wherein the planarization layer is located in the visible light receiving portion and the infrared receiving portion.

6. The image sensor of claim 1, wherein each of the color filter ball layer and the infrared pass filter ball layer is an etched layer.

7. The image sensor of claim 1, wherein
the color filter ball layer is adjacent to the infrared pass filter ball layer in the horizontal direction; and
a thickness of the color filter ball layer in the vertical direction is substantially equal to a thickness of the infrared pass filter ball layer in the vertical direction.

8. The image sensor of claim 7, further comprising:
a wafer disposed vertically above each of the visible light photodiode and the infrared photodiode, and further disposed immediately adjacent to and vertically below each of the infrared cutoff filter and the white filter;
wherein the planarization layer is disposed immediately adjacent to and vertically above each of the infrared cutoff filter and the white filter;
wherein each of the thickness of the infrared cutoff filter and the thickness of the white filter is substantially equal to a distance between the wafer and the planarization layer in the vertical direction.

9. The image sensor of claim 8, wherein the planarization layer is disposed immediately adjacent to and vertically below each of the color filter ball layer and the infrared pass filter ball layer.

10. An image sensor, comprising:
a visible light receiving portion configured to receive a visible light, wherein the visible light receiving portion comprises;
a color filter ball layer configured to focus the visible light and to provide color light;
a visible light photodiode; and
an infrared cutoff filter disposed on the visible light photodiode;
wherein the color filter ball layer is disposed on the infrared cutoff filter, and the visible light is received by the visible light photodiode after passing through the color filter ball layer and the infrared cutoff filter,
wherein an upper surface of the color filter ball layer is convex and is a curved surface, wherein a bottom surface of the color filter ball layer is a flat surface, wherein the color filter ball layer further comprises straight sidewalls;
an infrared receiving portion configured to receive infrared, wherein the infrared receiving portion comprises;
a white filter ball layer configured to focus the infrared and to allow passage of light;
an infrared photodiode; and
an infrared pass filter disposed on the infrared photodiode;
wherein the white filter ball layer is disposed on the infrared pass filter, and the infrared is received by the infrared photodiode after passing through the white filter ball layer and the infrared cutoff filter,
wherein an upper surface of the white filter ball layer is convex and is a curved surface, wherein a bottom surface of the white filter ball layer is a flat surface, wherein the white filter ball layer further comprises straight sidewalls;
wherein the visible light photodiode, the infrared cutoff filter, and the color filter ball layer are stacked in this order in a vertical direction;
wherein the infrared photodiode, the infrared pass filter, and the white filter ball layer are stacked in this order in the vertical direction;
wherein the infrared cutoff filter is adjacent to the infrared pass filter in a horizontal direction which is perpendicular to the vertical direction; and
wherein a thickness of the infrared cutoff filter in the vertical direction is substantially equal to a thickness of the infrared pass white filter in the vertical direction; and
a planarization layer configured to provide a flat surface to allow the color filter ball layer and the white filter ball layer to be directly attached on the flat surface of the planarization layer.

11. The image sensor of claim 10, further comprising a wafer located on the visible light photodiode and the infrared photodiode, wherein a first portion of the wafer is located in the visible light receiving portion and a second portion of the wafer is located in the infrared receiving portion.

12. The image sensor of claim 11, wherein the first portion of the wafer is located between the infrared cutoff filter and the visible light photodiode, and the second portion of the wafer is located between the infrared pass filter and the infrared photodiode.

13. The image sensor of claim 10, wherein the color filter ball layer comprises a red color filter unit, a green color filter unit, and a blue color filter unit.

14. The image sensor of claim 10, wherein the planarization layer is located in the visible light receiving portion and the infrared receiving portion.

15. The image sensor of claim 10, wherein each of the color filter ball layer and the white filter ball layer is an etched layer.

16. The image sensor of claim 10, wherein
the color filter ball layer is adjacent to the white filter ball layer in the horizontal direction; and
a thickness of the color filter ball layer in the vertical direction is substantially equal to a thickness of the white filter ball layer in the vertical direction.

17. The image sensor of claim 16, further comprising:
a wafer disposed vertically above each of the visible light photodiode and the infrared photodiode, and further disposed immediately adjacent to and vertically below each of the infrared cutoff filter and the infrared pass filter;
wherein the planarization layer is disposed immediately adjacent to and vertically above each of the infrared cutoff filter and the infrared pass filter;
wherein each of the thickness of the infrared cutoff filter and the thickness of the infrared pass filter is substantially equal to a distance between the wafer and the planarization layer in the vertical direction.

18. The image sensor of claim 17, wherein the planarization layer is disposed immediately adjacent to and vertically below each of the color filter ball layer and the white filter ball layer.

* * * * *